_(12)_ United States Patent
Kira

(10) Patent No.: US 10,224,888 B1
(45) Date of Patent: Mar. 5, 2019

(54) PARAMETER CONTROL DEVICE AND CONTROL METHOD

(71) Applicant: KAWAI MUSICAL INSTRUMENTS MANUFACTURING CO., LTD., Shizuoka (JP)

(72) Inventor: Yoshifumi Kira, Shizuoka (JP)

(73) Assignee: KAWAI MUSICAL INSTRUMENTS MANUFACTURING CO., LTD., Shizuoka (JP)

( * ) Notice: Subject to any disclaimer, the term of this patent is extended or adjusted under 35 U.S.C. 154(b) by 0 days.

(21) Appl. No.: 16/171,533

(22) Filed: Oct. 26, 2018

(30) Foreign Application Priority Data

Oct. 26, 2017 (JP) .................................. 2017-207264

(51) Int. Cl.
| | |
|---|---|
| *H03G 3/00* | (2006.01) |
| *H03G 3/02* | (2006.01) |
| *G10H 1/00* | (2006.01) |
| *G06F 3/16* | (2006.01) |

(52) U.S. Cl.
CPC .............. *H03G 3/02* (2013.01); *G06F 3/165* (2013.01); *G10H 1/0008* (2013.01)

(58) Field of Classification Search
CPC ...................................................... H03G 3/00
See application file for complete search history.

(56) References Cited

U.S. PATENT DOCUMENTS

| | | | | |
|---|---|---|---|---|
| 2015/0036144 | A1* | 2/2015 | Shimizu | G01D 5/3473 356/450 |
| 2016/0194027 | A1* | 7/2016 | Kondo | G01L 5/221 324/207.25 |
| 2016/0365815 | A1* | 12/2016 | Furuse | H01B 1/06 |
| 2018/0010929 | A1* | 1/2018 | Li | G01D 5/2415 |
| 2018/0115262 | A1* | 4/2018 | Kamio | H02P 6/16 |
| 2018/0283545 | A1* | 10/2018 | Yamada | F16H 61/32 |
| 2018/0335041 | A1* | 11/2018 | Yu | F04D 27/00 |

FOREIGN PATENT DOCUMENTS

JP     H09-54647 A     2/1997

\* cited by examiner

*Primary Examiner* — Olisa Anwah
(74) *Attorney, Agent, or Firm* — Westman, Champlin & Koehler, P.A.

(57) ABSTRACT

A parameter control device that controls an increase/decrease in parameter value based on pulses generated in response from an operator, includes a current value storage unit storing a current value of a parameter value in response to the operator, a measurement time setting unit setting a measurement time in which the number of generated pulses is measured from a current value of the parameter value and a maximum value or a minimum value that the parameter value can take, a threshold setting unit respectively setting thresholds of the number of generated pulses to the maximum value side or the minimum value side, a counting unit counting the number of generated pulses of the operator within the measurement time, a comparison unit comparing the counted number of generated pulses and the thresholds, and an output determination unit determining a parameter value to be output from the operator based on the comparison.

7 Claims, 6 Drawing Sheets

Fig.3

| TONE NAME | KNOB A | KNOB B | KNOB C | KNOB D |
|---|---|---|---|---|
| SK CONCERT GRAND | DAMPER RESONANCE<br>OFF, 1~10 | STEREO WIDTH<br>0~127 | OPEN/CLOSE OF COVER<br>CLOSE, OPEN 1~3 | TOUCH CURVE<br>HEAVY, NORMAL, LIGHT, OFF |
| CLASSIC EP | AUTO PAN:DEPTH<br>0~127 | AUTO PAN:SPEED<br>0.01~10.0Hz | REVERB:DEPTH<br>0~127 | TOUCH CURVE<br>HEAVY, NORMAL, LIGHT, OFF |
| DRAWBAR ORGAN | REVERB:DEPTH<br>0~127 | ROTARY:SPEED<br>SLOW, FAST | EFFECT VARIATION<br>VIBRATO/CHORUS, SINGLE | VIBRATO/CHORUS TYPE<br>V-1~3, C-1~3 |
| CHURCH ORGAN | REVERB:DEPTH<br>0~127 | DELAY:DRY WET<br>0~127 | FILTER CUT OFF<br>-64~0~+63 | FILTER RESONANCE<br>-64~0~+63 |
| STRINGS PAD | FILTER CUT OFF<br>-64~0~+63 | FILTER RESONANCE<br>-64~0~+63 | DCA ATTACK TIME<br>-64~0~+63 | DCA RELEASE TIME<br>-64~0~+63 |
| BRASS SECTION | REVERB:DEPTH<br>0~127 | CHORUS:SPREAD<br>0~127 | FILTER CUT OFF<br>-64~0~+63 | FILTER RESONANCE<br>-64~0~+63 |
| SAW REED | MONO<br>OFF, ON | PORTAMENTO<br>OFF, ON | FILTER CUT OFF<br>-64~0~+63 | FILTER RESONANCE<br>-64~0~+63 |
| ACOUSTIC BASE | DCA ATTACK TIME<br>-64~0~+63 | DCA DECAY TIME<br>-64~0~+63 | DCA SUSTAIN LEVEL<br>-64~0~+63 | DCA RELEASE TIME<br>-64~0~+63 |

Fig.5
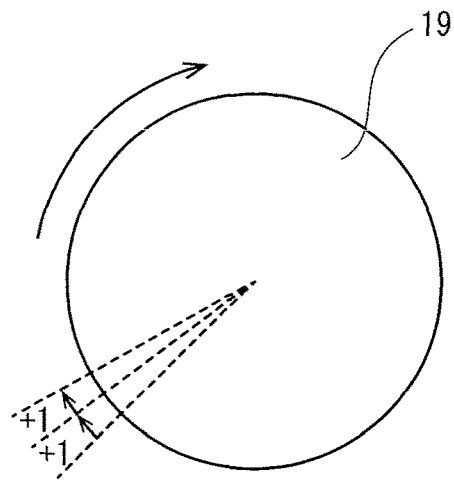
Fig.6
| PARAMETER | MAXIMUM VALUE | MINIMUM VALUE |
|---|---|---|
| A | 300 | 10 |
| B | 10 | 1 |
| C | 127 | 0 |
Fig.7
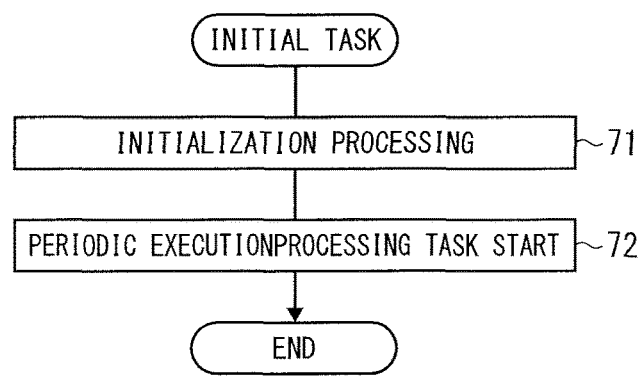

PARAMETER CONTROL DEVICE AND CONTROL METHOD

CROSS-REFERENCE TO RELATED APPLICATIONS

This application claims priority to Japanese Patent Application No. 2017-207264, filed on Oct. 26, 2017, the content of which is hereby incorporated by reference.

TECHNICAL FIELD

The present invention relates to parameter setting processing of an electronic music instrument, and specifically, to a parameter control device and control method for quickly changing a parameter value when changing the parameter value to a maximum value or a minimum value in an incremental rotary encoder.

BACKGROUND ART

Conventional setting of a parameter value using an analog volume has a problem in which, it has a limitation in resolution due to its limited operation range, and is not suitable for an operation to increase or decrease a parameter value one by one. The analog volume is an operator showing an absolute value, and when a function is assignable to the analog volume, an operator position and an actual value do not match each other in some cases, so that operability is not preferable.

These problems are solved by use of an incremental rotary encoder that starts from an arbitrary starting point and changes a parameter value according to a rotation amount. On the other hand, when a parameter value changes significantly from, for example, a minimum value to a maximum value, the operator needs to be moved (a dial or knob needs to be rotated) many times, and this cannot make a quick change in parameter value in the same way that an operator using an analog volume does.

Patent Document 1 discloses a technology to change, in a rotary encoder, a movement amount of a cursor per unit time according to a rotation speed (the cursor quickly moves when the knob is quickly rotated, and the cursor slowly moves when the knob is slowly rotated).

CITATION LIST

Patent Document

Patent Document 1: Japanese Published Unexamined Patent Application No. H9-054647

SUMMARY OF INVENTION

Technical Problem

However, according to the technology described in Patent Document 1, a movement amount of the cursor per unit time according to a rotation speed is constant, and when the technology is applied to control of parameter values of various parameters of an electronic music instrument (when there are a plurality of parameters), changing the movement amount per unit time for each parameter is not considered.

The present invention was made in view of the above-described circumstances, and an object thereof is to provide a parameter control device and control method which are used for an incremental rotary encoder and enable a quick change in parameter value as in the case of using an analog volume according to a type of the parameter.

Solution to Problem

In order to achieve the above-described object, in a parameter control device to control an increase/decrease in parameter value based on the number of pulses generated in response to desired angle rotation of an operator, Claim 1 has the following configuration.

a current value storage unit storing a current value of a parameter value in response to the operator;

a current value adding/subtracting unit adding/subtracting the number of generated pulses of the operator to the current value;

a counting unit calculating a cumulative pulse number count value by cumulatively counting the number of generated pulses of the operator;

a measurement time setting unit setting a measurement time in which the number of generated pulses is measured from a current value of the parameter value and a maximum value and a minimum value that the parameter value can take;

a threshold setting unit leading a desired angle of rotation from a current value of the parameter value and a maximum value or a minimum value that the parameter value can take, and respectively setting thresholds of the number of generated pulses corresponding to the rotation to the maximum value side and the minimum value side;

a comparison unit comparing the cumulative pulse number count value within the measurement time and the thresholds; and an output determination unit determining a parameter value to be output from the operator to the maximum value or the minimum value side or the current value added/subtracted value based on the comparison, and setting a determined value as a current value of the parameter value.

Claim 2 has the parameter control device according to Claim 1, wherein in rotation of the operator in a direction of increasing the parameter value, when the cumulative pulse number count value is larger than a maximum-side threshold, the parameter value is set to the maximum value.

Claim 3 has the parameter control device according to Claim 1, wherein in rotation of the operator in a direction of decreasing the parameter value, when the cumulative pulse number count value is larger than a minimum-side threshold, the parameter value is set to the minimum value.

Claim 4 has the parameter control device according to Claim 1, comprising:

a parameter selection unit selecting one parameter to be operated among a plurality of parameters; and a plurality of tables in which a maximum value and a minimum value of each of the plurality of parameters are set.

Claim 5 has the parameter control device according to Claim 2, comprising:

a parameter selection unit selecting one parameter to be operated among a plurality of parameters; and a plurality of tables in which a maximum value and a minimum value of each of the plurality of parameters are set.

Claim 6 has the parameter control device according to Claim 3, comprising:

a parameter selection unit selecting one parameter to be operated among a plurality of parameters; and a plurality of tables in which a maximum value and a minimum value of each of the plurality of parameters are set.

Claim 7 has a parameter control method for controlling an increase/decrease in parameter value based on the number of pulses generated in response to desired angle rotation of an operator, comprising:

a current value storing step of storing a current value of a parameter value in response to the operator;

a current value adding/subtracting step of adding/subtracting the number of generated pulses of the operator to/from the current value;

a counting step of calculating a cumulative pulse number count value by cumulatively counting the number of generated pulses of the operator;

a measurement time setting step of setting a measurement time in which the number of generated pulses is measured from a current value of the parameter value and a maximum value or a minimum value that the parameter value can take;

a threshold setting step of leading a desired angle of rotation from a current value of the parameter value and a maximum value or a minimum value that the parameter value can take, and respectively setting thresholds of the number of generated pulses corresponding to the rotation to the maximum value side and the minimum value side;

a comparing step of comparing the cumulative pulse number count value within the measurement time and the thresholds;

an output determining step of setting, in rotation in a direction of increasing the parameter value of the operator, the parameter value to the maximum value when the cumulative pulse number count value is larger than the maximum-side threshold, setting the parameter value to a value obtained through the current value adding/subtracting step when the cumulative pulse number count value is smaller than the maximum-side threshold, and on the other hand, in rotation in a direction of decreasing the parameter value of the operator, setting the parameter value to the minimum value when the cumulative pulse number count value is larger than the minimum-side threshold, and setting the parameter value to a value obtained through the current value adding/subtracting step when the cumulative pulse number count value is smaller than the minimum-side threshold.

Advantageous Effects of Invention

According to the parameter control device and control method of the present invention, in a case where an operator is an incremental rotary encoder, the number of pulses generated in response to rotation of the operator is cumulatively counted, and when it exceeds a threshold within a predetermined time, the number of pulses is jumped up to a maximum value or a minimum value of the parameter, and accordingly, the maximum value or minimum value can be set within one rotation of the operator, so that an operational feeling close to that of the analog volume can be obtained.

In addition, when a parameter to be assigned to the operator is selected, a threshold suitable for the parameter is calculated each time, so that optimum operations for various parameters can be performed.

As a result, even when the operator is an incremental rotary encoder, a parameter value can be quickly greatly changed as in the case of using an analog volume, so that parameter setting realizing both of detailed setting as in the case of using a rotary encoder and quick movement as in the case of using an analog volume can be performed.

BRIEF DESCRIPTION OF DRAWINGS

FIG. 3 is a table of tones and tone parameters associated with the tones.

FIG. 5 is a model view showing a relationship between a rotation angle of an operator and a pulse to be generated.

FIG. 6 is a table in which a maximum value and a minimum value of each tone parameter are set.

FIG. 7 is a flowchart showing parameter value control steps (initialization) by the parameter control device.

DESCRIPTION OF EMBODIMENTS

Hereinafter, an embodiment of the present invention is described in detail with reference to the drawings.

Figure 1:
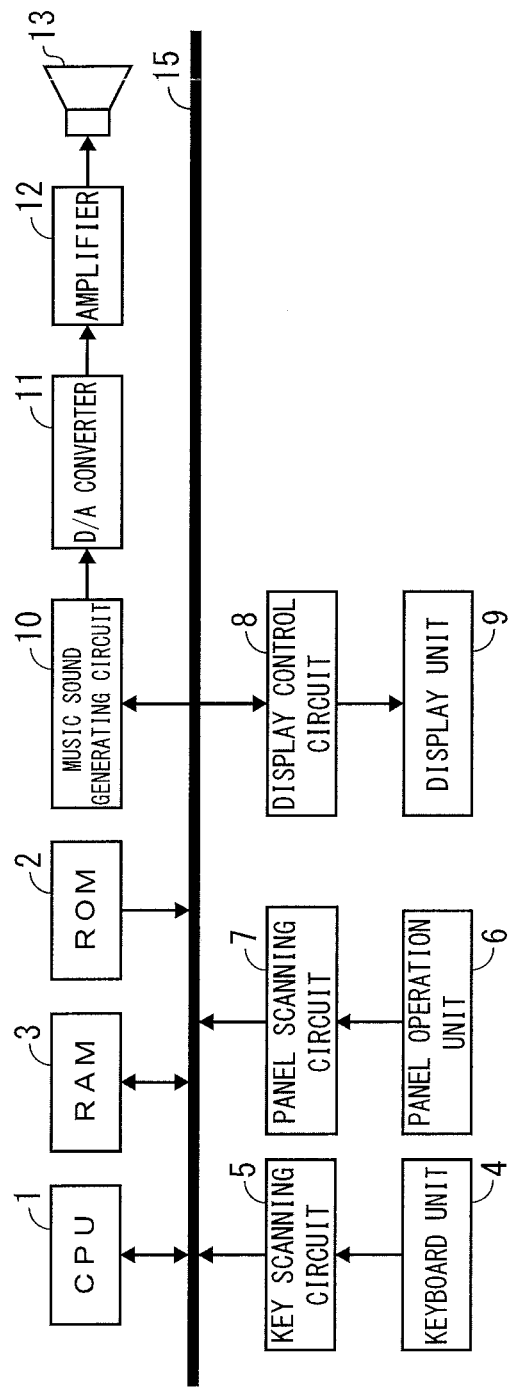
FIG. 1 is a block diagram showing a hardware configuration of a digital piano including a parameter control device.

FIG. 1 is a block diagram showing a major configuration of a digital piano including a parameter control device according to an embodiment of the present invention in which, a configuration to connect, to a bus 15, a CPU 1 that controls each processing in the digital piano, a ROM 2 storing various data, a RAM 3 serving as a buffer memory, a key scanning circuit 5 that generates information from a keyboard unit 4, a panel scanning circuit 7 that generates information from a panel operation unit 6, a display control circuit 8 that controls display on a display unit 9, and a music sound generating circuit 10 serving as a sound source, is constructed on a computer. The ROM 2 includes a program memory storing a program to control the digital piano, a music sound waveform memory storing data to create a sound source, and an automatic playing data memory storing music data for automatic playing.

The CPU (control unit) 1 controls the respective portions of the digital piano according to a control program stored in the program memory of the ROM 2. In the music sound waveform memory of the ROM 2, waveform data corresponding to a plurality of tones and tone parameters to generate a music sound by controlling the waveform data are stored. The tone parameters include address information and envelope control information, etc., of the waveform data.

In the automatic playing data memory of the ROM 2, recorded playing data are stored, and the playing data can be reproduced as a music sound according to supplied tempo information. As a recorded sound data storage means, in place of, or in addition to the automatic playing data memory, a CD-ROM or a card type ROM that can be removably loaded through an unillustrated interface from the outside can be used.

The RAM 3 may be used as a work area and a buffer of the CPU 1, and backed up by, for example, a battery. The tone parameters may be stored in the RAM 3 in a rewritable manner.

A keyboard device 4 includes a plurality of keys, and detects key event information showing key turning-on/off of each key and touch information (velocity value) showing a key depression strength.

The key scanning circuit 5 generates key event information and touch information (velocity value) based on a status of the touch sensor. These pieces of information are associated with key numbers and stored in the RAM 3.

The panel operation unit 6 includes various operation switches such as incremental rotary encoders (knobs) that change a sound volume and tone parameters described later, a tone select switch, a reproduction start switch for playing information stored in the automatic playing data memory, and a touch designation switch, etc.

The panel scanning circuit 7 generates switch event information showing a volume status and an on/off status of each switch on the panel operation unit 6, and these pieces of switch event information are associated with the respective operation switches and stored in the RAM 3.

The display control circuit 8 performs display corresponding to the switch event information from the panel operation unit 6 on the display unit 9. The display unit 9 includes a display consisting of a liquid crystal display screen, and on this display, control results in the CPU 1 can be displayed.

Figure 2:
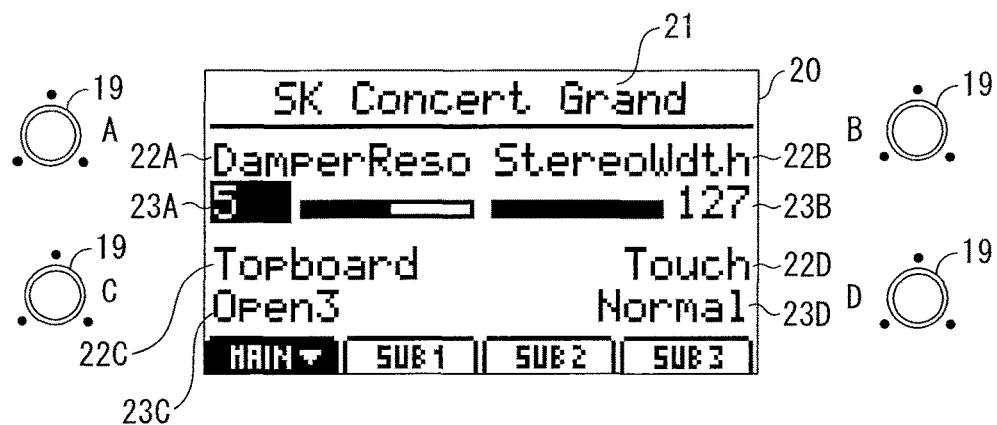
FIG. 2 is an explanatory view of a plurality of operators provided in the digital piano, and parameters displayed on a display unit so as to correspond to the respective operators.

The panel operation unit 6 and the display unit 9 as portions corresponding to tone parameter setting include, for example, as shown in FIG. 2, a liquid crystal display unit 20 disposed at a desired position on a front portion of the digital piano, and operators (a knob A, a knob B, a knob C, and a knob D) 19 to change tone parameters, disposed two each on both sides of the liquid crystal display unit.

The liquid crystal display unit 20 includes a tone name display unit 21 that displays a selected tone name, tone parameter display units 22A, 22B, 22C, and 22D that display tone parameters in response to the respective operators (knobs) 19, and setting status display units 23A, 23B, 23C, and 23D that display the set values (a volume value, a gain value, an on/off status, and a setting status, etc.).

A tone type can be selected from, for example, tone names on the left side of the table of FIG. 3. When a tone is selected, tone parameters to be adjusted with the respective knobs are tone parameters shown to the right of the tone name, and for example, when SK concert grand (grand piano sound in a concert hall) is selected as a tone, a damper resonance to change a resonance level, a stereo width to adjust a sound spreading effect, an open/close status of a cover of the grand piano, and a touch curve to adjust a weight of a key touch, are designated as tone parameters, and can be respectively adjusted with the knob A, the knob B, the knob C, and the knob D.

"Damper resonance" can be adjusted to be off or values of 1 to 10 with the knob A. "Stereo width" can be adjusted to values of 0 to 127 with the knob B. "Open/close of cover" can be adjusted to be closed or to values of open 1 to open 3 with the knob C. "Touch curve" can be set in four stages of heavy, normal, light, and off with the knob D. In the case of FIG. 2, "damper resonance" of the knob A is set to "5," "stereo width" of the knob B is set to "127 (maximum value)," "open/close of cover" of the knob C is set to "open 3," and "touch curve" of the knob D is set to "normal."

As tone types, as shown in FIG. 3, in addition to SK concert grand, Classic EP, Drawbar organ, Church organ, Strings pad, Brass section, Saw reed, Acoustic base, etc., can be selected, and for these types, tone parameters respectively adjustable with the knob A, the knob B, the knob C, and the knob D are set.

The tone parameters include a parameter that can be set to values of 0 to 127, a parameter that can be set to values of −64 to 0 to +64 (increased/decreased from a central gain set as 0), a parameter that can be set to values in four stages, and a parameter that can be set to values in two stages of on/off, etc., according to a parameter type.

Details of control processing for tone parameters using the operators (the knob A, the knob B, the knob C, and the knob D) as a feature of the present invention are described later.

A music sound generating circuit 10 serving as a sound source, a digital control oscillator (DCO), a digital control filter (DCF), a digital control amplifier (DCA), and an effector are provided, and a digital music sound signal is output based on waveform data readout from the music sound waveform memory of the ROM 2.

A sound production means includes a D/A converter 11, an amplifier circuit (amplifier) 12, and a speaker 13, and a digital music sound signal output from the music sound generating circuit 10 is converted into an analog signal by the D/A converter 11, amplified by the amplifier circuit (amplifier) 12, and then produced at a volume corresponding to the volume switch of the panel operation unit 6 through the speaker 17.

The respective components are connected to each other through the data bus 15 except for the D/A converter 11, the amplifier circuit (amplifier) 12, and the speaker 13. In order to obtain playing information, a MIDI interface may be provided as appropriate, and a memory card interface circuit, etc., can also be provided for the automatic playing data memory.

Figure 4:
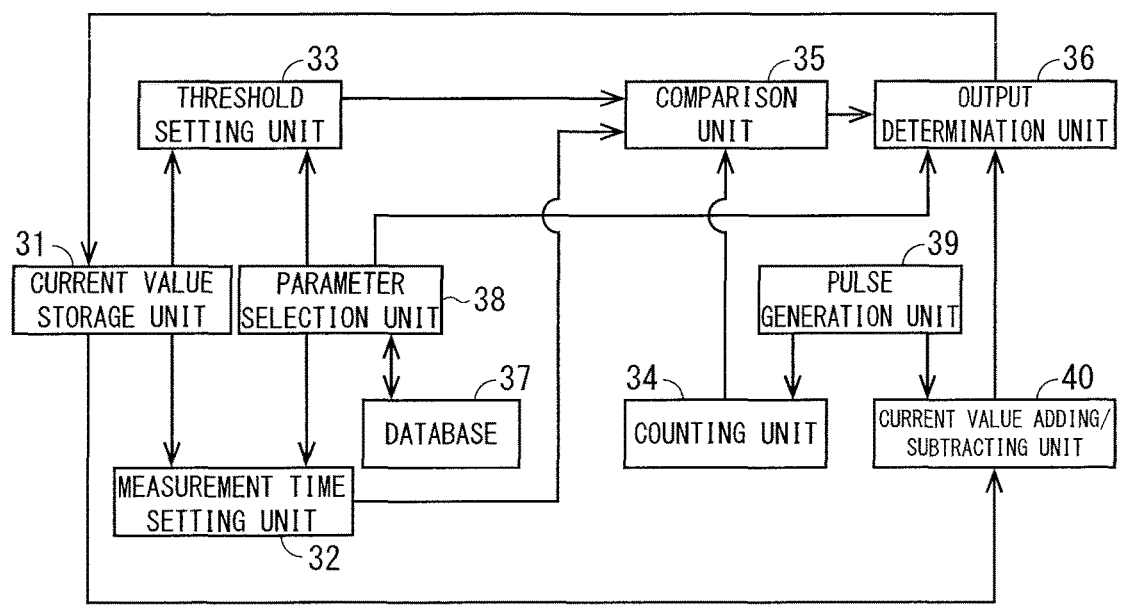
FIG. 4 is a block diagram to describe essential portion functions of the parameter control device.

Subsequently, the parameter control device of the digital piano is described with reference to FIG. 4 and FIG. 5.

The parameter control device is a device to control an increase/decrease in tone parameter value based on pulses generated in response to rotation of the operator (the knob A, the knob B, the knob C, the knob D) 19 using the incremental rotary encoder.

The parameter control device is configured to include a current value storage unit 31 that stores current values of tone parameter values, a measurement time setting unit 32 that sets a measurement time in which a cumulative pulse number count value is measured, a threshold setting unit 33 that sets thresholds of the cumulative pulse number count value to a maximum value side or a minimum value side, respectively, a counting unit 34 that calculates a cumulative pulse number count value by counting a cumulative pulse number within the measurement time, a comparison unit 35 that compares the cumulative pulse number count value and the thresholds, an output determination unit 36 that determines a parameter value to be output from an operator based on the comparison, a database 37 that stores information on a maximum value and a minimum value of each tone parameter, a parameter selection unit 38 that selects one tone to be operated among a plurality of tones and designates corresponding tone parameters, a pulse generation unit 39 that generates pulses corresponding to a rotation angle of a shaft of the operator 19, and a current value adding/subtracting unit 40 that changes a parameter value based on the number of generated pulses.

These units 31 to 38 consist of portions corresponding to the panel operation unit 6, the panel scanning circuit 7, the CPU 1, the ROM 2, the RAM 3, the display control circuit 8, and the display unit 9 shown in FIG. 1.

The operator (knob) 19 consists of an incremental rotary encoder as a columnar rotating body as shown in FIG. 5, and is configured so that a number of pulses corresponding to a rotation angle of the shaft of the operator are generated by the pulse generation unit 39, and are added to or subtracted from a current value of a parameter by the current value adding/subtracting unit 40.

Each operator 19 outputs an increase/decrease value from an arbitrary starting point, and can make any number of rotations, so that setting with high resolution can be made.

In addition, each operator (knob) 19 is configured so that one pulse (+1) is generated each time the operator rotates by a desired angle (for example, 5 degrees), and the rotation angle can be detected by cumulatively counting the number of generated pulses from the arbitrary starting point.

When a rotation amount of the operator (knob) 19 within a fixed time is large, a parameter value is changed by the number of generated pulses or more. Whether the rotation amount is large is judged based on whether the number of pulses corresponding to the rotation amount is larger than a desired threshold (number of pulses), and this threshold is calculated from a relationship between a current position of the operator and a maximum value or a minimum value. Steps of calculation of the thresholds are described later.

The current value storage unit 31 stores a current value of the parameter value determined by the output determination unit 36.

The measurement time setting unit 32 and the threshold setting unit 33 set a measurement time in which the number of generated pulses is cumulatively counted and a threshold of the cumulative pulse number from a current value of the parameter value and a maximum value or a minimum value that the parameter value can take when a rotation direction (value increasing/decreasing direction) is changed by an operation of the operator 19 or when the cumulative pulse number reaches the threshold set at that time point. A maximum value (max) and a minimum value (min) that the parameter value can take are managed in the database 37 based on data showing maximum values and minimum values of tone parameters corresponding to the respective tones shown in FIG. 6 (a table in which maximum values and minimum values of the respective tone parameters are set).

By selecting a tone, etc., with the parameter selection unit 38, among the respective tone parameters stored in the database 37, a tone parameter to be operated is selected.

For example, when a current value of the parameter value is val, one pulse is generated per an angle of 5 degrees, a maximum rotation range of the volume is set to 270 degrees by referring to that of an analog volume, and a maximum/minimum rotation time T0 is one second, a clockwise rotation time Tr and a counterclockwise rotation time Tl in which the prescribed number of pulses is counted are set to:

Measurement time (clockwise rotation): $Tr=(max-val)/(max-min)*T0$ (Equation 1)

Measurement time (counterclockwise rotation): $Tl=(val-min)/(max-min)*T0$ (Equation 2)

As a threshold of the number of generated pulses, the threshold setting unit 33 sets a threshold to a maximum value side or a minimum value side each time the operator 19 is operated.

In each set value described above, the number of pulses (threshold) for jump to a maximum value or a minimum value is set to:

Threshold (the number of clockwise rotation pulses): $Pr=(max-val)/(max-min)*270/5$ (Equation 3)

Threshold (the number of counterclockwise rotation pulses): $Pl=(val-min)/(max-min)*270/5$ (Equation 4)

The counting unit 34 counts the number of generated pulses in response to the incremental rotary encoder output from the pulse generation unit 39, and in the comparison unit 35, the counted number of generated pulses is compared with the threshold (the number of clockwise rotation pulses) or the threshold (the number of counterclockwise rotation pulses).

The output determination unit 36 determines a parameter value to be output by the operator based on the comparison in the comparison unit 35.

That is, in rotation of the operator in a direction of increasing the parameter value (clockwise rotation), when the cumulative pulse number count value is larger than the maximum-side threshold (the number of clockwise rotation pulses) in the comparison unit 35, the parameter value is determined to be the maximum value if the pulse count time is within the measurement time set in the measurement time setting unit 32.

In rotation of the operator in a direction of decreasing the parameter value (counterclockwise rotation), when the cumulative pulse number count value is larger than the minimum-side threshold (the number of counterclockwise rotation pulses) in the comparison unit 35, the parameter value is determined to be the minimum value if the pulse count time is within the measurement time set in the measurement time setting unit 32.

When the cumulative pulse number count value does not exceed the threshold or the count time is not within the measurement time, the parameter value is determined to be a value obtained by directly adding the number of pulses as an increase/decrease value to the parameter current value.

For example, as a tone parameter of the operator, in a case where the parameter A shown in FIG. 6 is assigned, starting from a current value of 10, when the operator is rotated clockwise to the maximum value side, from (Equation 1), $Tr=(max-val)/(max-min)*T0$ $=(300-10)/(300-10)$ $=1$ sec.

Therefore, the measurement time is one second, and from (Equation 3), $Pr=(max-val)/(max-min)*270/5$ $=(300-10)/(300-10)*54$ $=54.$ Therefore, when the operator is rotated clockwise so that pulses exceeding the threshold of 54 pulses are generated within the measurement time of 1 second, the parameter value is set to the maximum value of 300.

That is, when changing the parameter value from the minimum value (10) to the maximum value (300), if the conditions for jumping-up are satisfied, jumping-up is enabled by rotation corresponding to 54 pulses (54×5 degrees=270 degrees), and therefore, the parameter value can be changed to the maximum value by the same operation as an operation using an analog volume with a maximum rotation range of 270 degrees.

In a case where the same tone parameter (parameter A shown in FIG. 6) is assigned, starting from a current value of 100, when the operator is rotated clockwise to the maximum value side, from (Equation 1), $Tr=(max-val)/(max-min)*T0$ $=(300-100)/(300-10)$ $=200/290$ $=0.6896$ sec.

Therefore, the measurement time is 0.69 seconds, and from (Equation 3), $Pr=(max-val)/(max-min)*270/5$ $=(300-100)/(300-10)*54$ $=37.2.$ Therefore, when the operator is rotated clockwise so that pulses exceeding the threshold of 37 pulses are generated within the measurement time of 0.69 seconds, the parameter value is set to the maximum value of 300.

In the case where the same tone parameter (parameter A shown in FIG. 6) is assigned, starting from a current value of 100, when the operator is rotated counterclockwise to the minimum value side, from (Equation 2), $Tl=(val-\min)/(\max-\min)*T0$ $=(100-10)/(300-10)$ $=90/290$ $=0.310$ sec.

Therefore, the measurement time is 0.31 seconds, and from (Equation 4), $Pl=(val-\min)/(\max-\min)*270/5$ $=(100-10)/(300-10)*54$ $=16.7.$ Therefore, when the operator is rotated counterclockwise so that pulses exceeding the threshold of 17 pulses are generated within the measurement time of 0.31 seconds, the parameter value is set to the minimum value of 10.

When the parameter B is assigned as the tone parameter of the operator, through the same processing as described above, the following setting is made, however, in the case of a parameter with low resolution like the parameter B, the maximum/minimum value has already been reached, so that the value does not jump up in this particular case.

Clockwise rotation starting from current value=1: measurement for Tr=1 sec., an increase exceeding 54 pulses causes setting to the maximum value of 10

Clockwise rotation starting from current value=5: measurement for Tr=560 msec., an increase exceeding 30 pulses causes setting to the maximum value of 10

Counterclockwise rotation starting from current value=5: measurement for Tl=440 msec., a decrease exceeding 24 pulses causes setting to the minimum value of 1

When the parameter C is assigned as a tone parameter of the operator, through the same processing as described above, the following setting is made.

Clockwise rotation starting from current value=0: measurement for Tr=1 sec., an increase exceeding 54 pulses causes setting to the maximum value of 127

Clockwise rotation starting from current value=100: measurement for Tr=210 msec., a decrease exceeding 11 pulses causes setting to the maximum value of 127

Counterclockwise rotation starting from current value=100: measurement for Tl=790 msec., a decrease exceeding 43 pulses causes setting to the minimum value of 0

When the cumulative pulse number count value does not exceed the threshold or when the threshold is not exceeded within the measurement time, processing of directly adding the number of pulses as an increase/decrease value to the parameter current value (not to cause jumping-up to the maximum or minimum value) is performed.

Figure 8:
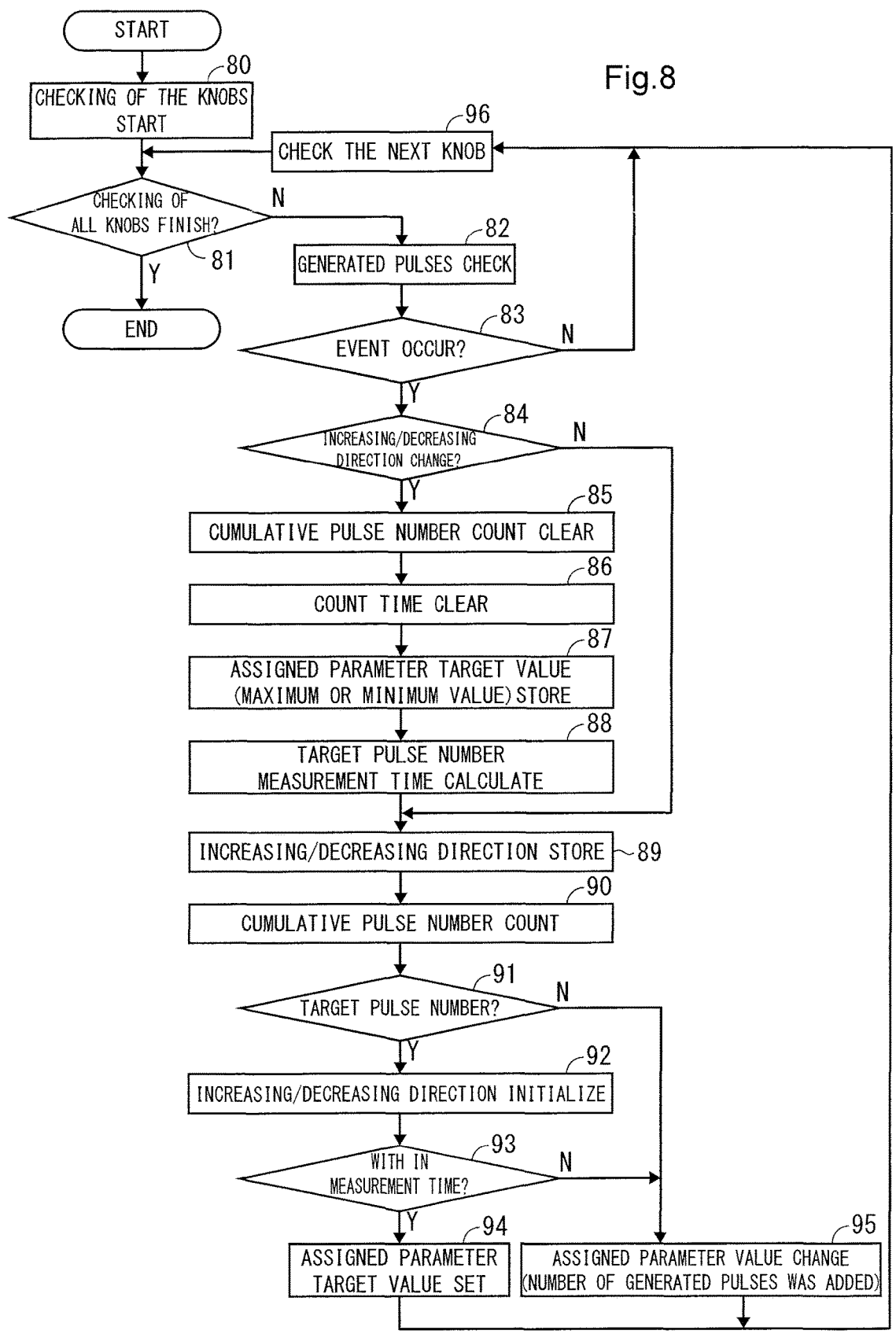
FIG. 8 is a flowchart showing parameter value control steps (knob scanning) by the parameter control device.

Next, steps of processing to be performed by the parameter control device are described with reference to the flowcharts shown in FIG. 7 and FIG. 8.

When the power supply of the digital piano is turned on and the parameter control device is activated, initialization processing for initialization of the current values of the respective operators, etc., is performed (Step 71), and thereafter, periodic execution processing to check the statuses of the operators periodically is started (Step 72).

In the periodic execution processing, checking of the operators is started (Step 80), whether checking of all operators has been finished is judged (Step 81), and when checking is finished, this processing is ended. In the example shown in FIG. 2, the operators (knobs) 19 are four in number, so that checking of all four operators has been finished is judged. This periodic execution processing is executed at time intervals set in advance, for example, every 1 msec.

When checking of all operators is not finished, the number of generated pulses output from the pulse generation unit 39 of an operator (knob) as a checking target is checked (Step 82).

Next, whether a pulse generating event has occurred in response to an operation of the operator is judged (Step S83), and when no event occurs, the process returns to Step S81 to check the next operator (knob) (Step 96).

When a pulse generating event occurs by the operator (knob) in Step 83, whether the increasing/decreasing direction has been changed is judged (Step 84). When the increasing/decreasing direction is judged to have been changed in Step 84, the cumulative pulse number count value is cleared (Step 85), the count time is cleared (Step 86), and an assigned parameter target value (maximum or minimum value) is stored (Step 87), and then, a target pulse number and a measurement time are calculated (Step 88), and the increasing/decreasing direction is stored (Step 89). When there is no change in increasing/decreasing direction in Step 84, the increasing/decreasing direction showing whether the rotation direction of the operator is clockwise or counterclockwise is stored (Step 89).

The cumulative pulse number is counted by adding the number of generated pulses generated in response to a rotating operation of the operator (Step 90), and it is judged whether the count value has exceeded the target pulse number (threshold) (Step 91).

When the cumulative pulse number count value exceeds the target pulse number (threshold), the increasing/decreasing direction is initialized (Step 92), and it is judged whether the target pulse number has been reached within the measurement time (Step 93).

When the target pulse number is reached within the measurement time, the conditions for jumping-up to the maximum value or minimum value are satisfied, so that the parameter value of the operator is set to an assigned parameter target value (changed by jumping-up) (Step 94).

When the cumulative pulse number count value does not exceed the target pulse number (threshold), or when the target pulse number is not reached within the measurement time, it is judged that conditions for jumping-up to the maximum value or minimum value are not satisfied, and setting to the parameter value to which the number of generated pulses was added (changing by a normal operation) is made (Step 95).

According to the parameter control device described above, when the number of pulses generated in response to rotation of the operator exceeds the threshold determined each time of starting counting based on a current value within the predetermined time, by jumping-up to the maximum value or minimum value of the parameter, the maximum value or minimum value of the parameter can be set within one rotation, so that an operational feeling closer to that of an analog volume can be obtained.

Also, even in the case where the parameter assignment to the operator such as an assignable knob is dynamically changed, a threshold suitable for the parameter is calculated each time, so that an operation without a sense of discomfort can always be performed for various parameters.

As a result, even with the incremental rotary encoder, a significant change in parameter value can be quickly made, so that parameter setting realizing both of detailed setting as in the case of using a rotary encoder and quick movement as in the case of using an analog volume can be made.

REFERENCE SIGNS LIST

1 CPU (control unit)
2 ROM
3 RAM
4 keyboard unit
5 key scanning circuit
6 panel operation unit
7 panel scanning circuit
8 display control circuit
9 display unit
10 music sound generating circuit
11 D/A converter
12 amplifier circuit (amplifier)
13 speaker
15 bus
19 operator (the knob A, the knob B, the knob C, the knob D)
20 liquid crystal display unit
21 tone name display unit
22 tone parameter display unit
23 setting status display unit
31 current value storage unit
32 measurement time setting unit
33 threshold setting unit
34 counting unit
35 comparison unit
36 output determination unit
37 database
38 parameter selection unit
39 pulse generation unit
40 current value adding/subtracting unit

What is claimed is:

1. A parameter control device to control an increase/decrease in parameter value based on the number of pulses generated in response to desired angle rotation of an operator, comprising:
   a current value storage unit storing a current value of a parameter value in response to the operator;
   a current value adding/subtracting unit adding/subtracting the number of generated pulses of the operator to the current value;
   a counting unit calculating a cumulative pulse number count value by cumulatively counting the number of generated pulses of the operator;
   a measurement time setting unit setting a measurement time in which the number of generated pulses is measured from a current value of the parameter value and a maximum value and a minimum value that the parameter value can take;
   a threshold setting unit leading a desired angle of rotation from a current value of the parameter value and a maximum value or a minimum value that the parameter value can take, and respectively setting thresholds of the number of generated pulses corresponding to the rotation to the maximum value side and the minimum value side;
   a comparison unit comparing the cumulative pulse number count value within the measurement time and the thresholds; and
   an output determination unit determining a parameter value to be output from the operator to the maximum value or the minimum value side or the current value added/subtracted value based on the comparison, and setting a determined value as a current value of the parameter value.

2. The parameter control device according to claim 1, wherein in rotation of the operator in a direction of increasing the parameter value, when the cumulative pulse number count value is larger than a maximum-side threshold, the parameter value is set to the maximum value.

3. The parameter control device according to claim 1, wherein in rotation of the operator in a direction of decreasing the parameter value, when the cumulative pulse number count value is larger than a minimum-side threshold, the parameter value is set to the minimum value.

4. The parameter control device according to claim 1, comprising:
   a parameter selection unit selecting one parameter to be operated among a plurality of parameters; and
   a plurality of tables in which a maximum value and a minimum value of each of the plurality of parameters are set.

5. The parameter control device according to claim 2, comprising:
   a parameter selection unit selecting one parameter to be operated among a plurality of parameters; and
   a plurality of tables in which a maximum value and a minimum value of each of the plurality of parameters are set.

6. The parameter control device according to claim 3, comprising:
   a parameter selection unit selecting one parameter to be operated among a plurality of parameters; and
   a plurality of tables in which a maximum value and a minimum value of each of the plurality of parameters are set.

7. A parameter control method for controlling an increase/decrease in parameter value based on the number of pulses generated in response to desired angle rotation of an operator, comprising:
   a current value storing step of storing a current value of a parameter value in response to the operator;
   a current value adding/subtracting step of adding/subtracting the number of generated pulses of the operator to/from the current value;
   a counting step of calculating a cumulative pulse number count value by cumulatively counting the number of generated pulses of the operator;
   a measurement time setting step of setting a measurement time in which the number of generated pulses is measured from a current value of the parameter value and a maximum value or a minimum value that the parameter value can take;
   a threshold setting step of leading a desired angle of rotation from a current value of the parameter value and a maximum value or a minimum value that the parameter value can take, and respectively setting thresholds of the number of generated pulses corresponding to the rotation to the maximum value side and the minimum value side;

a comparing step of comparing the cumulative pulse number count value within the measurement time and the thresholds;

an output determining step of setting, in rotation in a direction of increasing the parameter value of the operator, the parameter value to the maximum value when the cumulative pulse number count value is larger than the maximum-side threshold, setting the parameter value to a value obtained through the current value adding/subtracting step when the cumulative pulse number count value is smaller than the maximum-side threshold, and on the other hand, in rotation in a direction of decreasing the parameter value of the operator, setting the parameter value to the minimum value when the cumulative pulse number count value is larger than the minimum-side threshold, and setting the parameter value to a value obtained through the current value adding/subtracting step when the cumulative pulse number count value is smaller than the minimum-side threshold.

* * * * *